US012604565B2

(12) United States Patent
Fang et al.

(10) Patent No.: US 12,604,565 B2
(45) Date of Patent: Apr. 14, 2026

(54) MICRO LIGHT-EMITTING COMPONENT

(71) Applicant: PlayNitride Display Co., Ltd., MiaoLi County (TW)

(72) Inventors: Hsin-Chiao Fang, MiaoLi County (TW); Shen-Jie Wang, MiaoLi County (TW); Yen-Lin Lai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 645 days.

(21) Appl. No.: 17/976,870

(22) Filed: Oct. 31, 2022

(65) Prior Publication Data

US 2024/0097070 A1 Mar. 21, 2024

(30) Foreign Application Priority Data

Sep. 19, 2022 (TW) .................................. 111135288

(51) Int. Cl.
H10H 20/815 (2025.01)
H10H 20/81 (2025.01)
H10H 20/824 (2025.01)

(52) U.S. Cl.
CPC ...... H10H 20/815 (2025.01); H10H 20/8215 (2025.01); H10H 20/824 (2025.01)

(58) Field of Classification Search
CPC ............. H10H 20/815; H10H 20/8215; H10H 20/824; H10H 20/8312
See application file for complete search history.

(56) References Cited

U.S. PATENT DOCUMENTS

| | | | | |
|---|---|---|---|---|
| 6,107,648 | A | * | 8/2000 | Shakuda .............. H10H 20/833 |
| | | | | 257/190 |
| 2004/0238839 | A1 | | 12/2004 | Lai et al. |
| 2005/0230695 | A1 | | 10/2005 | Takayama |
| 2006/0175620 | A1 | | 8/2006 | Komori |

(Continued)

FOREIGN PATENT DOCUMENTS

| | | | | |
|---|---|---|---|---|
| CN | 102931305 | | 2/2013 | |
| CN | 114122205 | A * | 3/2022 | ......... H10H 20/8242 |

(Continued)

OTHER PUBLICATIONS

"Office Action of Taiwan Counterpart Application", issued on May 5, 2023, p. 1-p. 8.

(Continued)

*Primary Examiner* — Matthew C Landau
*Assistant Examiner* — Dmitriy Yemelyanov
(74) *Attorney, Agent, or Firm* — JCIPRNET

(57) ABSTRACT

A micro light-emitting component including a first type cladding layer, a light-emitting layer, a second type cladding layer, a plurality of window layers and at least one interposer is provided. The light-emitting layer is located on the first type cladding layer, and the second type cladding layer is located on the light-emitting layer. The light-emitting layer is located between the first type cladding layer and the second type cladding layer. The window layers are located on the second type cladding layer. The interposer is located between any two adjacent of the window layers. An ion doping concentration of the interposer is less than or equal to an ion doping concentration of the window layers.

18 Claims, 13 Drawing Sheets

(56)     References Cited

U.S. PATENT DOCUMENTS

| | | |
|---|---|---|
| 2007/0045608 A1 | 3/2007 | Wang et al. |
| 2016/0273264 A1 | 9/2016 | Myli et al. |

FOREIGN PATENT DOCUMENTS

| | | |
|---|---|---|
| CN | 114497298 | 5/2022 |
| JP | 2004022833 | 1/2004 |
| TW | 200924241 | 6/2009 |

OTHER PUBLICATIONS

"Office Action of China Counterpart Application", issued on Apr. 26, 2025, p. 1-p. 12.
"Notice of allowance of China counterpart Application", issued on Sep. 22, 2025, p. 1-p. 4.

* cited by examiner 141
150
140
160
130
120
110
103

101

105

102

100D

100E 141
151b
151a
140
160
130
120
110
103
101
105
102

100F

MICRO LIGHT-EMITTING COMPONENT

CROSS-REFERENCE TO RELATED APPLICATION

This application claims the priority benefit of Taiwan application serial no. 111135288, filed on Sep. 19, 2022. The entirety of the above-mentioned patent application is hereby incorporated by reference herein and made a part of this specification.

BACKGROUND

Technical Field

The disclosure relates to a light-emitting component, and in particular relates to a micro light-emitting component.

Description of Related Art

During the development of light-emitting diodes, researchers have developed high-brightness visible light-emitting diodes (LEDs) with aluminum gallium indium phosphide (AlGaInP), such as red LEDs, yellow LEDs, or orange LEDs. In order to solve the problem of uneven current distribution outside the ohmic contact region, a common practice is to form a window layer with gallium phosphide (GaP) on a p-type cladding layer (e.g., a p-type aluminum gallium indium phosphide layer). However, because the lattice constant of the window layer does not match the lattice constant of the p-type cladding layer, dislocation defects with high distribution density are easily formed in the window layer, which increases the leakage current of the light-emitting diode, resulting in poor luminous efficiency of the light-emitting diode.

SUMMARY

The disclosure provides a micro light-emitting component with better luminous efficiency.

The disclosure provides a micro light-emitting component, which includes a first type cladding layer, a light-emitting layer, a second type cladding layer, multiple window layers, and at least one interposer. The light-emitting layer is located on the first type cladding layer, and the second type cladding layer is located on the light-emitting layer. The light-emitting layer is located between the first type cladding layer and the second type cladding layer. The window layers are located on the second type cladding layer. The interposer is located between any two adjacent of the window layers. An ion doping concentration of the interposer is less than or equal to an ion doping concentration of the window layers.

The disclosure provides a micro light-emitting component, which includes a first type cladding layer, a light-emitting layer, a second type cladding layer, multiple window layers, and at least one interposer. The light-emitting layer is located on the first type cladding layer, and the second type cladding layer is located on the light-emitting layer. The light-emitting layer is located between the first type cladding layer and the second type cladding layer. The window layers are located on the second type cladding layer, and a material of the window layers has a first lattice constant. The interposer is located between any two adjacent of the window layers, and a material of the interposer has a second lattice constant. A ratio of the second lattice constant to the first lattice constant is greater than or equal to 1.01 or less than 0.99.

Based on the above, in the micro light-emitting component of the disclosure, any two adjacent window layers are separated by an interposer, and the interposer may be used to block the continuous generation of dislocation defects from a lower window layer to an upper window layer, so that the dislocation defect density in the window layers are reduced, while the leakage current situation is improved. Due to the improvement of the leakage current situation, it facilitates the improvement to the luminous efficiency of the micro light-emitting component.

In order to make the above-mentioned features and advantages of the disclosure comprehensible, embodiments accompanied with drawings are described in detail below.

DETAILED DESCRIPTION OF DISCLOSED EMBODIMENTS

Figure 1A:
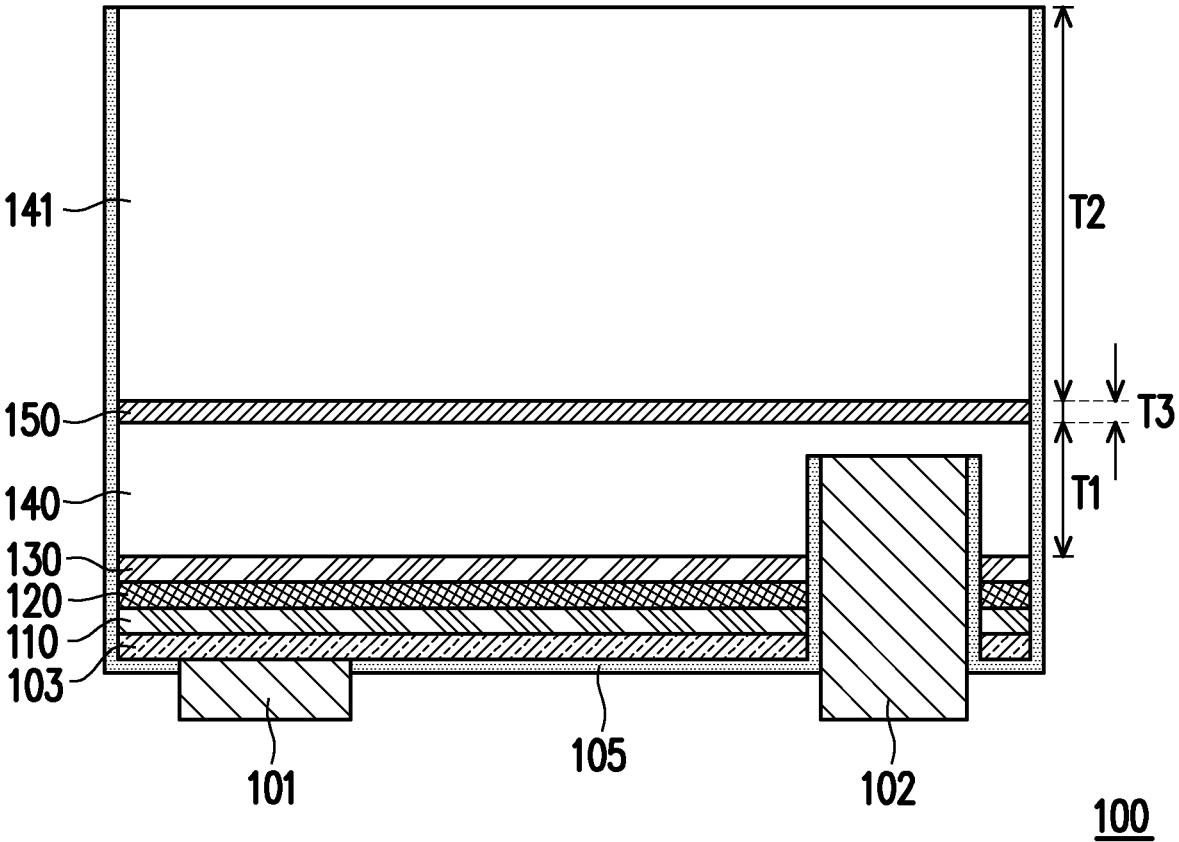
FIG. 1A, FIG. 1B, FIG. 2A, FIG. 2B, FIG. 3A to FIG. 3D, FIG. 4A, FIG. 4B, FIG. 5 and FIG. 6 are cross-sectional schematic views of micro light-emitting components according to different embodiments of the disclosure.

FIG. 1A, FIG. 1B, FIG. 2A, FIG. 2B, FIG. 3A to FIG. 3D, FIG. 4A, FIG. 4B, FIG. 5 and FIG. 6 are cross-sectional schematic views of micro light-emitting components according to different embodiments of the disclosure. Referring to FIG. 1A, in this embodiment, a micro light-emitting component 100 includes a first type cladding layer 110, a light-emitting layer 120, a second type cladding layer 130, a first window layer 140, a second window layer 141, and an interposer 150. The first type cladding layer 110 may be a quaternary or ternary material, such as an n-type aluminum gallium indium phosphide layer or aluminum indium phosphide layer, and the second type cladding layer 130 may be a quaternary or ternary material, such as a p-type aluminum gallium indium phosphide layer or aluminum indium phosphide layer. The light-emitting layer 120 may have a multiple quantum well (MQW) structure, and is located on (or covers) the first type cladding layer 110. In addition, the second type cladding layer 130 is located on (or covers) the light-emitting layer 120, and the light-emitting layer 120 is located between the first type cladding layer 110 and the second type cladding layer 130.

The first type cladding layer 110, the light-emitting layer 120, and the second type cladding layer 130 are sequentially stacked from bottom to top, and the first window layer 140, the interposer 150, and the second window layer 141 are sequentially stacked from bottom to top on the second type cladding layer 130. Furthermore, the first window layer 140 is located on (or covers) the second type cladding layer 130, in which the interposer 150 is located on (or covers) the first window layer 140, and the second window layer 141 is located on (or covers) the interposer 150. That is, the interposer 150 is located between the first window layer 140 and the second window layer 141 and separates the first window layer 140 from the second window layer 141. In addition, the first window layer 140 is closest to the second type cladding layer 130, and the second window layer 141 is relatively farther away from the second type cladding layer 130.

The first window layer 140 and the second window layer 141 may be gallium phosphide (GaP) or indium phosphide (InP) window layers, and are used to diffuse current to improve the uniformity of current distribution outside the ohmic contact region. In some embodiments, the material of the interposer 150 includes $(Al_xGa_{1-x})_{1-y}In_yP$, where $1 \geq x \geq 0$, and $1 > y > 0$. In some embodiments, $1 > x > 0.5$, and $y > 0.5$, but not limited thereto. In some embodiments, the material of the interposer 150 includes SiC, SiC, AlN, GaN, ZnO, BeSe, MgS, BeTe, GaAs, AlAs, InP, MgSe, CdSe, or ZnTe.

In some embodiments, the first window layer 140, the second window layer 141, and the interposer 150 may be doped with metal ions (e.g., magnesium ions). The ion doping concentration of the second window layer 141 is greater than the ion doping concentration of the first window layer 140, and the ion doping concentration of the interposer 150 is less than or equal to the ion doping concentration of the first window layer 140. In some embodiments, both the first window layer 140 and the second window layer 141 may be doped with metal ions (e.g., magnesium ions), the ion doping concentration of the second window layer 141 is greater than the ion doping concentration of the first window layer 140, and the ion doping concentration of the interposer 150 is 0, that is, the interposer 150 is not doped with metal ions. Since the ion doping concentration of the first window layer 140 closest to the second type cladding layer 130 is low, the diffusion of the dopant ions to the second type cladding layer 130 may be reduced.

As shown in FIG. 1A, the micro light-emitting component 100 further includes a first type electrode 101, a second type electrode 102, and a contact layer 103. The contact layer 103 is located between the first type electrode 101 and the first type cladding layer 110, and the first type electrode 101 is electrically connected to the first type cladding layer 110 through the contact layer 103. On the other hand, the contact layer 103, the first type cladding layer 110, the light-emitting layer 120, the second type cladding layer 130, the first window layer 140, the interposer 150, and the second window layer 141 are sequentially stacked from bottom to top, and the first window layer 140 is located between the interposer 150 and the second type cladding layer 130. Specifically, the second type electrode 102 passes through the contact layer 103, the first type cladding layer 110, the light-emitting layer 120 and the second type cladding layer 130, and is electrically connected to the first window layer 140. That is, the second type electrode 102 is electrically connected to the second type cladding layer 130 through the first window layer 140.

As shown in FIG. 1A, the remaining outer surfaces of the micro light-emitting component 100 excluding the light-emitting surface are covered by an insulating layer 105. The first type electrode 101 passes through the insulating layer 105 covering the contact layer 103 to electrically connect (or contact) the contact layer 103. In addition, the second type electrode 102 passes through the contact layer 103, the first type cladding layer 110, the light-emitting layer 120 and the second type cladding layer 130, and is finally electrically connected to the first window layer 140. In addition, a portion of the sidewall surface of the second type electrode 102 located in the contact layer 103, the first type cladding layer 110, the light-emitting layer 120, the second type cladding layer 130, and the first window layer 140 are covered by the insulating layer 105, to be electrically isolated from the contact layer 103, the first type cladding layer 110, the light-emitting layer 120, and the second type cladding layer 130. However, the end surface of the second type electrode 102 located in the first window layer 140 is not covered by the insulating layer 105 so as to be electrically connected to the first window layer 140.

In this embodiment, the interposer 150 separates the first window layer 140 from the second window layer 141. Dislocation defects formed in the first window layer 140 due to the mismatch between the lattice constant of the first window layer 140 and the lattice constant of the second type cladding layer 130 may be blocked by the interposer 150. That is, the interposer 150 may be used to block the dislocation defects continuously generated from the first window layer 140 to the second window layer 141, so as to reduce the dislocation defect density in the window layer, especially to reduce the dislocation defect density in the second window layer 141, while improving the leakage current situation. Due to the improvement of the leakage current situation, it facilitates the improvement to the luminous efficiency of the micro light-emitting component 100.

Specifically, the first window layer 140 is closer to the second type cladding layer 130 than the second window layer 141, and under the blocking of the interposer 150, the dislocation defect density in the second window layer 141 is reduced. That is, the dislocation defect density in the first window layer 140 is greater than the dislocation defect density in the second window layer 141. For example, the ratio of the dislocation defect density in the first window layer 140 to the dislocation defect density in the second window layer 141 is between 2 and 100, so that the current may be conducted more in the second window layer 141 of low defect density.

In some embodiments, the sum of the thickness T1 of the first window layer 140 and the thickness T2 of the second window layer 141 may be more than 50 times and less than 1500 times the thickness T3 of the interposer 150, such as 200 times or 700 times. In some embodiments, the thickness T2 of the second window layer 141 is greater than the thickness T1 of the first window layer 140, and may be more than 2.5 times and less than 10 times the thickness T1 of the first window layer 140. In this way, the characteristics of the overall window layer depends more on the second window layer 141 with a higher thickness ratio, or even the third window layer and above, rather than the first window layer 140, which results in a significant reduction in the dislocation defect density in the overall window layer.

In some embodiments, the thickness T1 of the first window layer 140 may be less than or equal to 1500 nanometers (nm). In some embodiments, the second window layer 141 is farther away from the second type cladding layer 130 than the first window layer 140, and serves as a window layer of the second type cladding layer 130 farthest away. The thickness T2 of the second window layer 141 may be more than 0.7 times the sum of the thickness T1 of the first window layer 140, the thickness T2 of the second window layer 141, and the thickness T3 of the interposer 150. In some embodiments, the thickness T3 of the interposer 150 is less than or equal to 100 nm, and may be between 6 nm and 30 nm, such as 10 nm. Once the thickness of the interposer 150 is too large, defects may easily appear on the interposer 150 itself. On the contrary, once the thickness is too thin, the defects continuously generated from the first window layer 140 to the second window layer 141 cannot be blocked.

In some embodiments, the lattice constants of the first window layer 140 and the second window layer 141 are equal to 5.45 angstroms, and the lattice constant of the interposer 150 is greater than or equal to 5.5045 angstroms (e.g., greater than or equal to 1.01 times the lattice constants of the first window layer 140 and the second window layer 141) or less than or equal to 5.3955 Angstroms (e.g., less than or equal to 0.99 times the lattice constants of the first window layer 140 and the second window layer 141). Taking the lattice constant of the interposer 150 greater than or equal to 5.5045 angstroms as an example, the lattice constant of the interposer 150 is preferably greater than or equal to 5.65 angstroms.

In some embodiments, the materials of the first window layer 140 and the second window layer 141 have a first lattice constant, and the material of the interposer 150 has a second lattice constant. The second lattice constant may be 1.01 times or more the first lattice constant, or 0.99 times or less the second lattice constant. In some embodiments, the second lattice constant may be 1.02 times or more the first lattice constant, or 0.98 times or less the second lattice constant. In some embodiments, the second lattice constant may be 1.03 times or more the first lattice constant, or 0.97 times or less the second lattice constant.

In some embodiments, the materials of the first window layer 140 and the second window layer 141 have a first lattice constant of 5.45 angstroms, and the material of the interposer 150 have a second lattice constant of 5.65 angstroms. In some embodiments, the material of the first window layer 140 and the second window layer 141 is GaP, and the material of the interposer 150 is $Al_{0.5}In_{0.5}P$. In some embodiments, the lattice constant difference between the interposer 150 and the first window layer 140 (or the second window layer 141) is larger than the lattice constant difference between the second type cladding layer 130 and the first window layer 140 (or the second window layer 141), to improve the effect of blocking the dislocation defects continuously generated from the first window layer 140 to the second window layer 141.

Figure 1B:
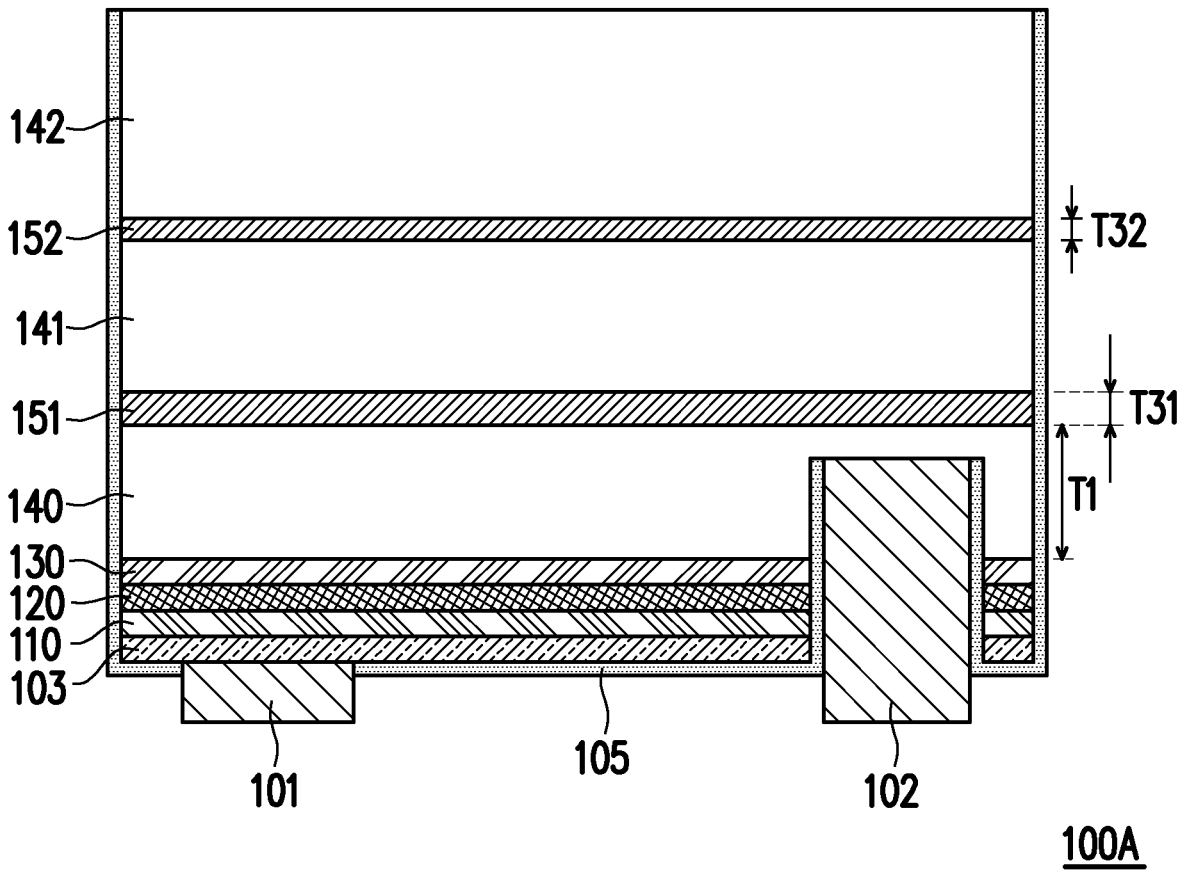

The micro light-emitting component 100A shown in FIG. 1B is similar in structure to the micro light-emitting component 100 shown in FIG. 1A, the difference is that, as shown in FIG. 1i, the micro light-emitting component 100A further includes a third window layer 142 on the second window layer 141, and the interposer includes a first interposer 151 and a second interposer 152 separated from each other. The first interposer 151 is located between the first window layer 140 and the second window layer 141, and the second interposer 152 is located between the second window layer 141 and the third window layer 142.

That is, the first window layer 140 and the second window layer 141 are separated by the first interposer 151, and the second window layer 141 and the third window layer 142 are separated by the second interposer 152. Therefore, the first interposer 151 may be used to block dislocation defects continuously generated from the first window layer 140 to the second window layer 141, and the second interposer 152 may be used to block dislocation defects continuously generated from the second window layer 141 to the third window layer 142. Therefore, the dislocation defect density in the third window layer 142 farthest away from the second type cladding layer 130 is less than the dislocation defect density in the second window layer 141, and the dislocation defect density in the second window layer 141 is less than the dislocation defect density in the first window layer 140. In other words, the dislocation defect density in the window layer closest to the second type cladding layer 130 is greater than the dislocation defect density in the remaining window layers.

As shown in FIG. 1B, the first interposer 151 is closer to the second type cladding layer 130 than the second interposer 152, and the thickness T31 of the first interposer 151 is greater than the thickness T32 of the second interposer 152, but the thickness relationship between the two is not limited thereto. In addition, the ion doping concentration of the first window layer 140 is less than the ion doping concentration of the second window layer 141 and the ion doping concentration of the third window layer 142.

Figure 2A:
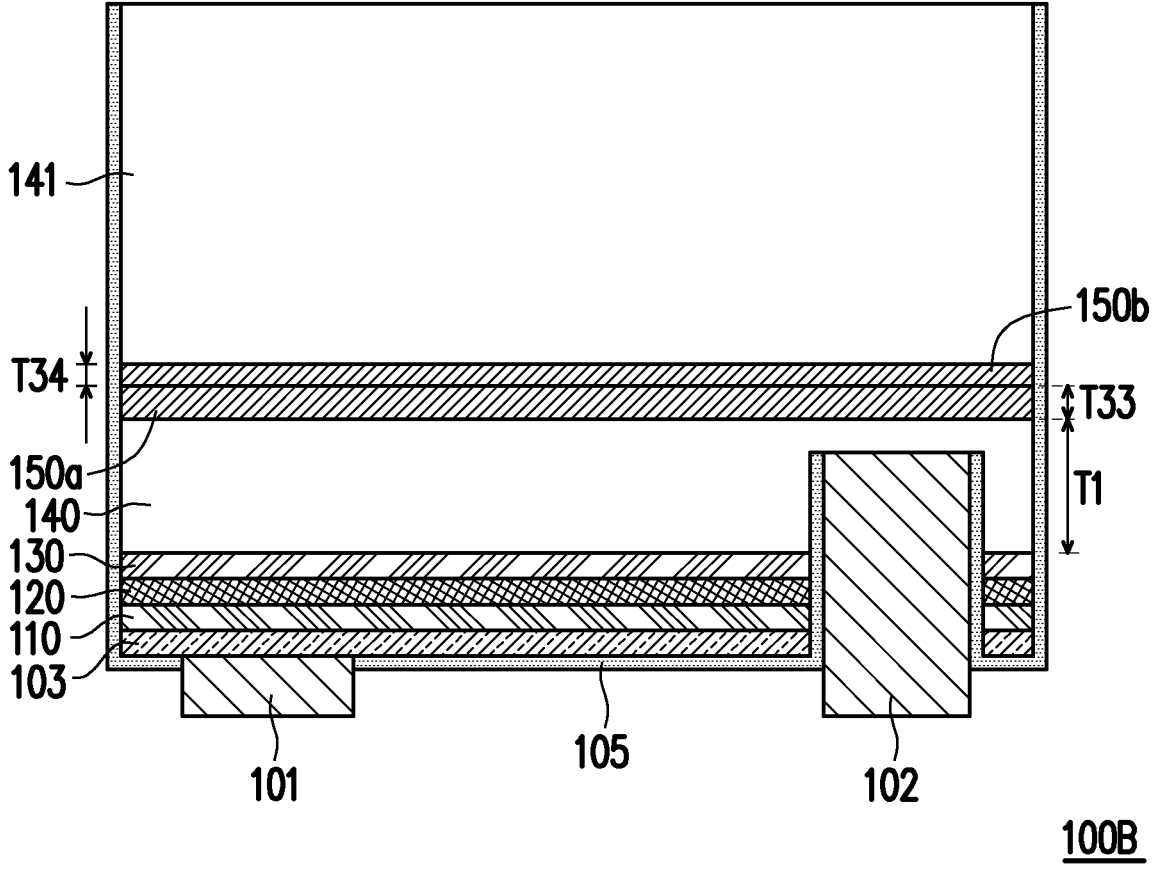

The micro light-emitting component 100B shown in FIG. 2A is similar in structure to the micro light-emitting component 100 shown in FIG. 1A, the difference is that, as shown in FIG. 2A, the interposer includes a sub-interposer 150a and a sub-interposer 150b that are connected. In some embodiments, the sub-interposer 150a is closer to the second type cladding layer 130 than the sub-interposer 150b, and the thickness T33 of the sub-interposer 150a is greater than the thickness T34 of the sub-interposer 150b. In addition, the lattice constant difference between the sub-interposer 150b and the first window layer 140 (or the second window layer 141) is less than the lattice constant difference between the sub-interposer 150a and the first window layer 140 (or the second window layer 141), to further reduce the lattice constant difference between the interposer and the second window layer 141.

In some embodiments, the interposer includes three or more connected sub-interposers, and the farther away the sub-interposer is from the second type cladding layer 130, the smaller the thickness of the sub-interposer. In addition, the farther away the sub-interposer is from the second type cladding layer 130, the smaller the lattice constant difference between the sub-interposer and the first window layer 140 (or the second window layer 141). In some embodiments, the material of the sub-interposer 150a and the sub-interposer 150b may be $(Al_xGa_{1-x})_{1-y}In_yP$, and the element ratio of the sub-interposer 150a is different from the element ratio of the sub-interposer 150b. In some embodiments, the material of the sub-interposer 150a and the sub-interposer 150b may be SiC, SiC, AlN, GaN, ZnO, BeSe, MgS, BeTe, GaAs, AlAs, InP, MgSe, CdSe or ZnTe, and the material of the sub-interposer 150a and the sub-interposer 150b may be the same or different.

Figure 2B:
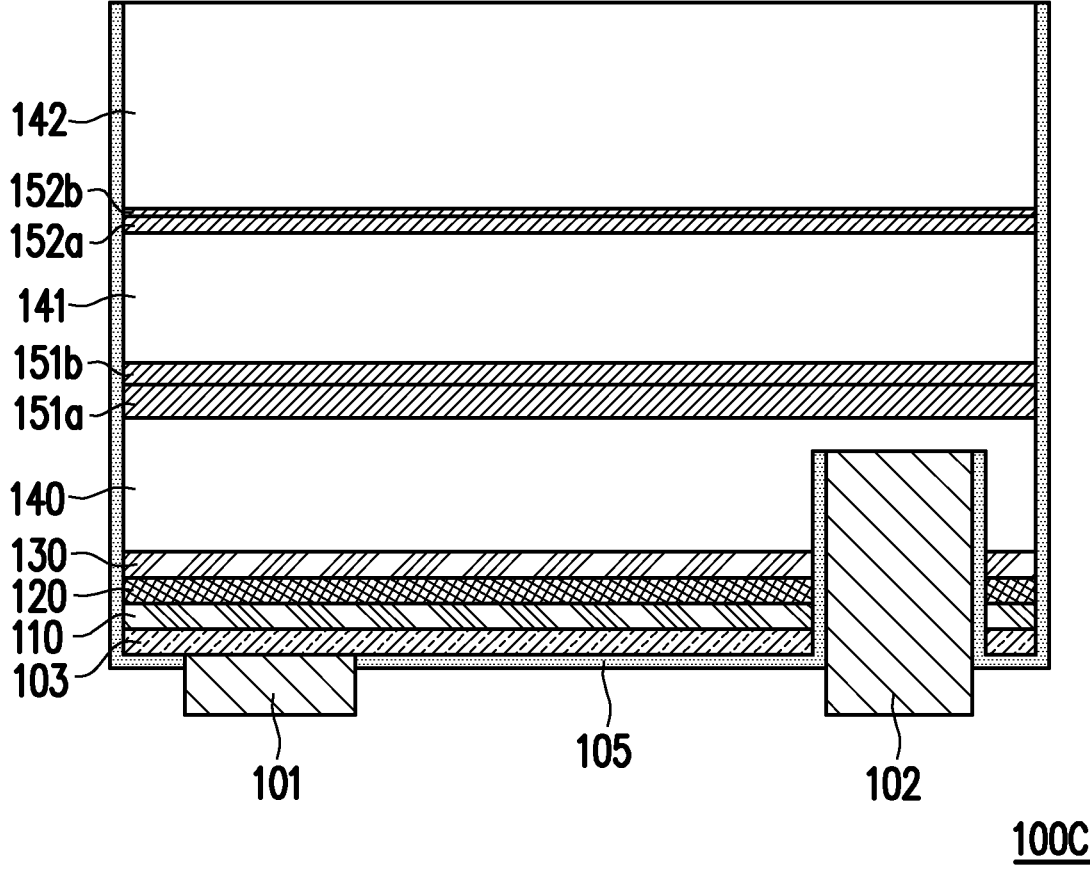

The micro light-emitting component 100C shown in FIG. 2B is similar in structure to the micro light-emitting component 100A shown in FIG. 1B, the difference is that, as shown in FIG. 2B, the first interposer includes a sub-interposer 151a and a sub-interposer 151b, and the second interposer includes a sub-interposer 152a and a sub-interposer 152b.

Taking any interposer as an example, the farther away the sub-interposer is from the second type cladding layer 130, the smaller the thickness of the sub-interposer, and the farther away the sub-interposer is from the second type cladding layer 130, the smaller the lattice constant difference between the sub-interposer and the first window layer 140 (or the second window layer 141). In addition, the material of the connected sub-interposers may be $(Al_xGa_{1-x})_{1-y}In_yP$, and the element ratio of the connected sub-interposers may be different, or the material of the connected sub-interposer may be SiC, SiC, AlN, GaN, ZnO, BeSe, MgS, BeTe, GaAs, AlAs, InP, MgSe, CdSe, or ZnTe, and the material of the connected sub-interposers may be the same or different.

In some embodiments, the number of interposers may be multiple layers, which may be separated from each other. At least one of the interposers has a single-layer structure, and at least another one of the interposers may include two or more layers of sub-interposers, or each layer of interposers includes two or more layers of sub-interposers.

Figure 3A:
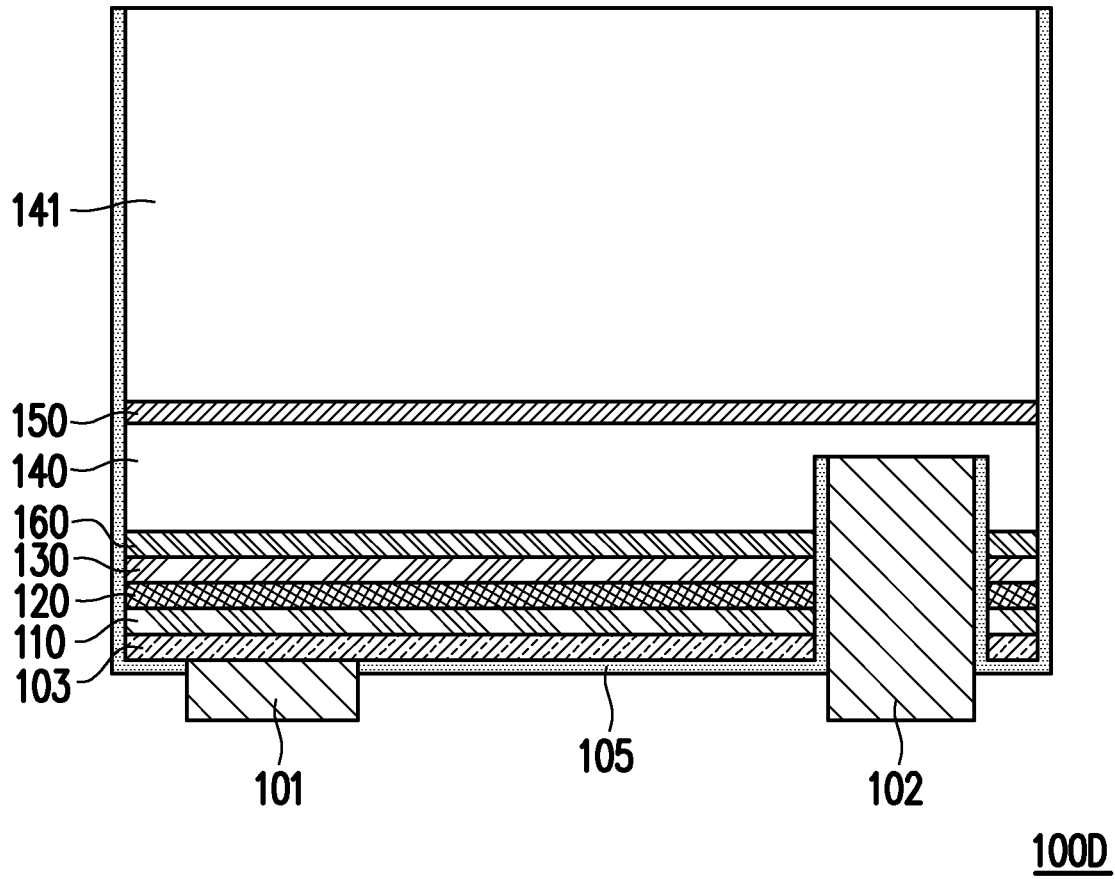

The micro light-emitting component 100D shown in FIG. 3A is similar in structure to the micro light-emitting component 100 shown in FIG. 1A, the difference is that, as shown in FIG. 3A, the micro light-emitting component 100D further includes a buffer layer 160, and the material may be $Al_{0.5}In_{0.5}P$. The buffer layer 160 is located between the second type cladding layer 130 and the first window layer 140, and the buffer layer 160 and the interposer 150 are located on opposite sides of the first window layer 140. On the other hand, the second type electrode 102 passes through the buffer layer 160 and is inserted into the first window layer 140 to be electrically connected to the first window layer 140.

Figure 3B:
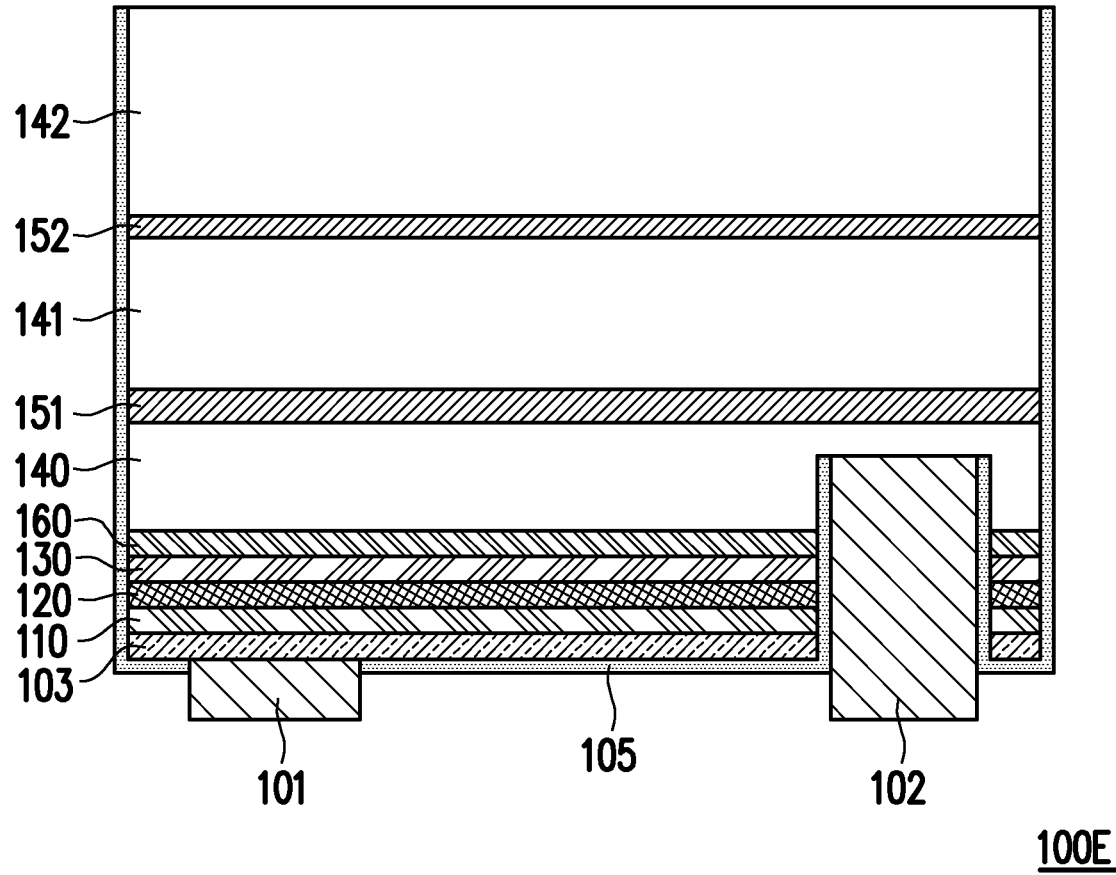

The micro light-emitting component 100E shown in FIG. 3B is similar in structure to the micro light-emitting component 100A shown in FIG. 1B, the difference is that, as shown in FIG. 3B, the micro light-emitting component 100E further includes a buffer layer 160, and the material may be $Al_{0.5}In_{0.5}P$. The buffer layer 160 is located between the second type cladding layer 130 and the first window layer 140, and the buffer layer 160 and the first interposer 151 are located on opposite sides of the first window layer 140. On the other hand, the second type electrode 102 passes through the buffer layer 160 and is inserted into the first window layer 140 to be electrically connected to the first window layer 140.

In other embodiments similar to the micro light-emitting component 100E, the second type electrode 102 may further pass through the first interposer 151 and be inserted into the second window layer 141 to be electrically connected to the second window layer 141. Because the second type electrode 102 is electrically connected to the second window layer 141 with a smaller dislocation defect density, it is beneficial for diffusing the current to improve the uniformity of current distribution outside the ohmic contact region.

Figure 3C:
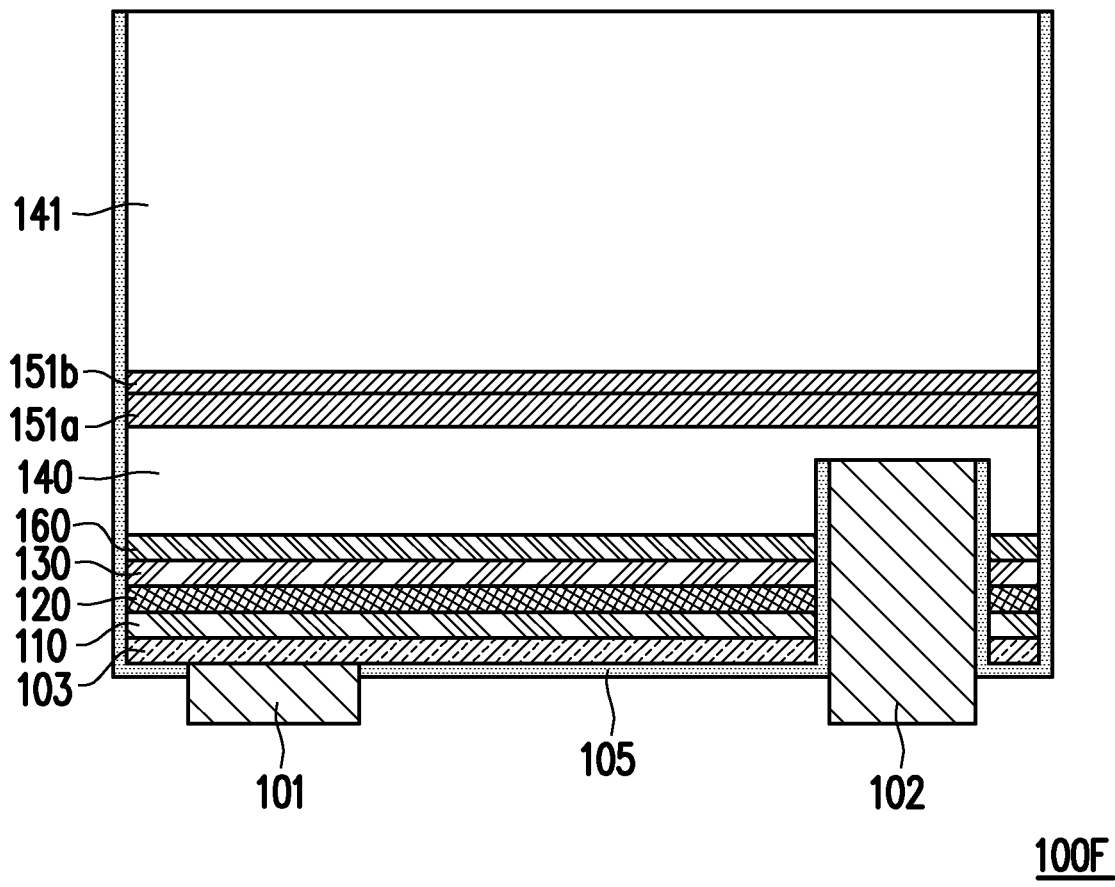

The micro light-emitting component 100F shown in FIG. 3C is similar in structure to the micro light-emitting component 100B shown in FIG. 2A, the difference is that, as shown in FIG. 3C, the micro light-emitting component 100F further includes a buffer layer 160, and the material may be $Al_{0.5}In_{0.5}P$. The buffer layer 160 is located between the second type cladding layer 130 and the first window layer 140, and the buffer layer 160 and the interposer 150 are located on opposite sides of the first window layer 140. On the other hand, the second type electrode 102 passes through the buffer layer 160 and is inserted into the first window layer 140 to be electrically connected to the first window layer 140.

Figure 3D:
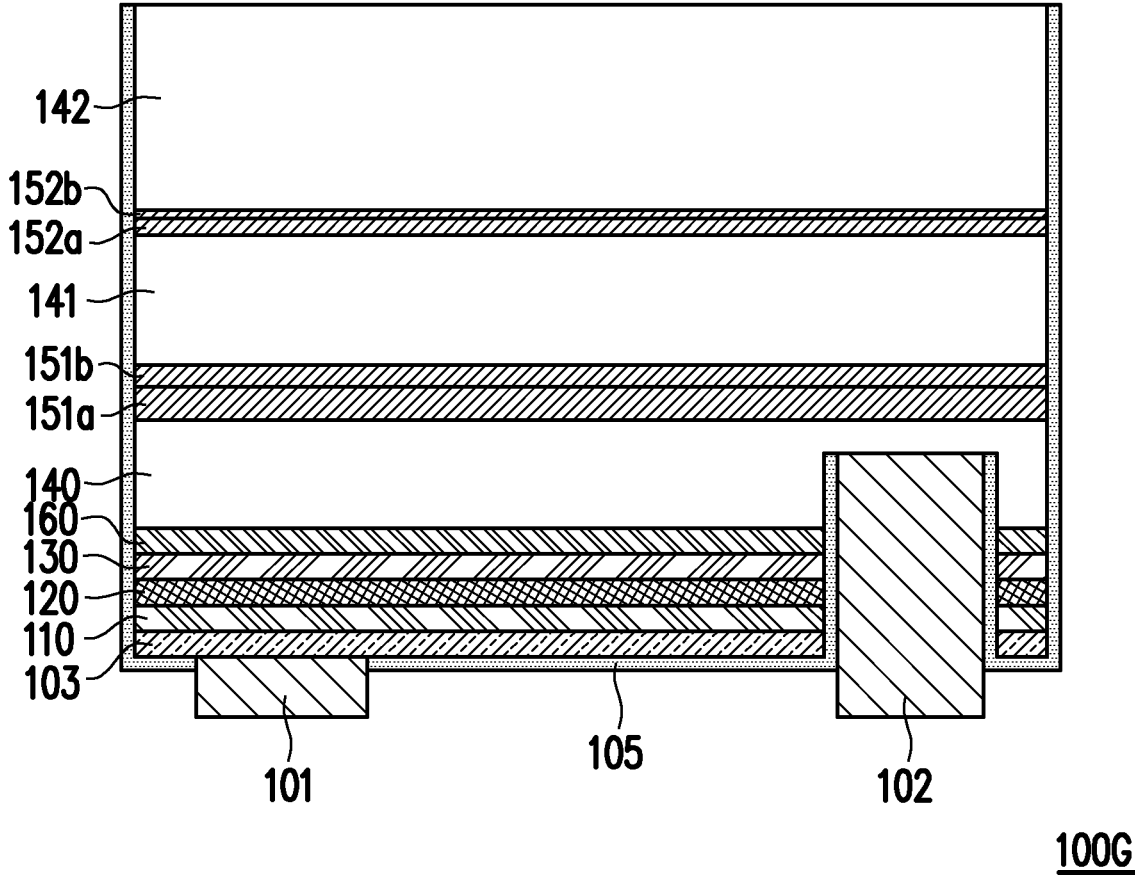

The micro light-emitting component 100G shown in FIG. 3D is similar in structure to the micro light-emitting component 100C shown in FIG. 2B, the difference is that, as shown in FIG. 3D, the micro light-emitting component 100G further includes a buffer layer 160, and the material may be $(Al_mGa_{1-m})_{1-n}In_nP$, where $1 \geq m \geq 0$, and $1 > n > 0$. The buffer layer 160 is located between the second type cladding layer 130 and the first window layer 140, and the buffer layer 160 and the first interposer 151 are located on opposite sides of the first window layer 140. On the other hand, the second type electrode 102 passes through the buffer layer 160 and is inserted into the first window layer 140 to be electrically connected to the first window layer 140.

Figure 4A:
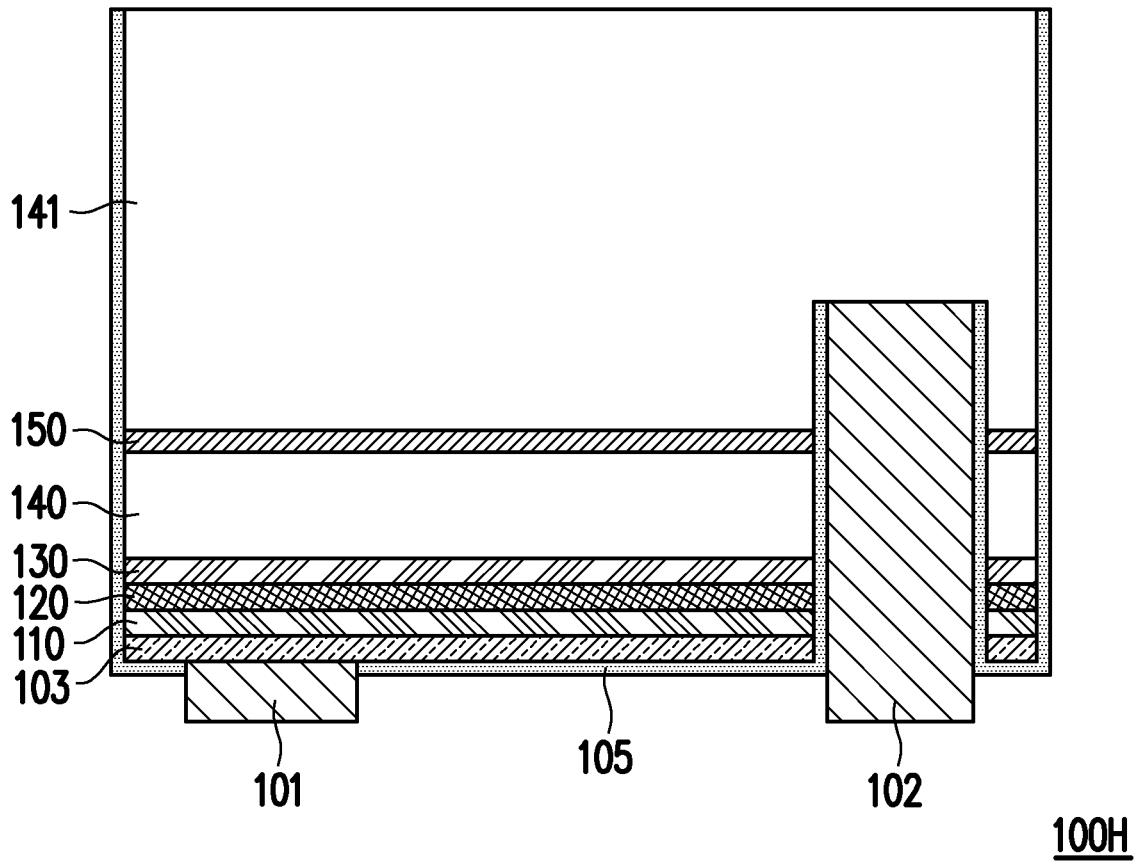

The micro light-emitting component 100H shown in FIG. 4A is similar in structure to the micro light-emitting component 100 shown in FIG. 1A, the difference is that, as shown in FIG. 4A, the second type electrode 102 passes through the interposer 150 and is inserted into the second window layer 141 to be electrically connected to the second window layer 141, which facilitates the current to flow and distribute in the second window layer 141 with relatively less dislocation defect density, which then enters the first window layer 140.

In other embodiments similar to the micro light-emitting component 100H, the second type electrode 102 may further pass through the sub-interposer 150a and the sub-interposer 150b and be inserted into the second window layer 141 to be electrically connected to the second window layer 141. Because the second type electrode 102 is electrically connected to the second window layer 141 with a smaller dislocation defect density, it is beneficial for diffusing the current to improve the uniformity of current distribution outside the ohmic contact region.

Figure 4B:
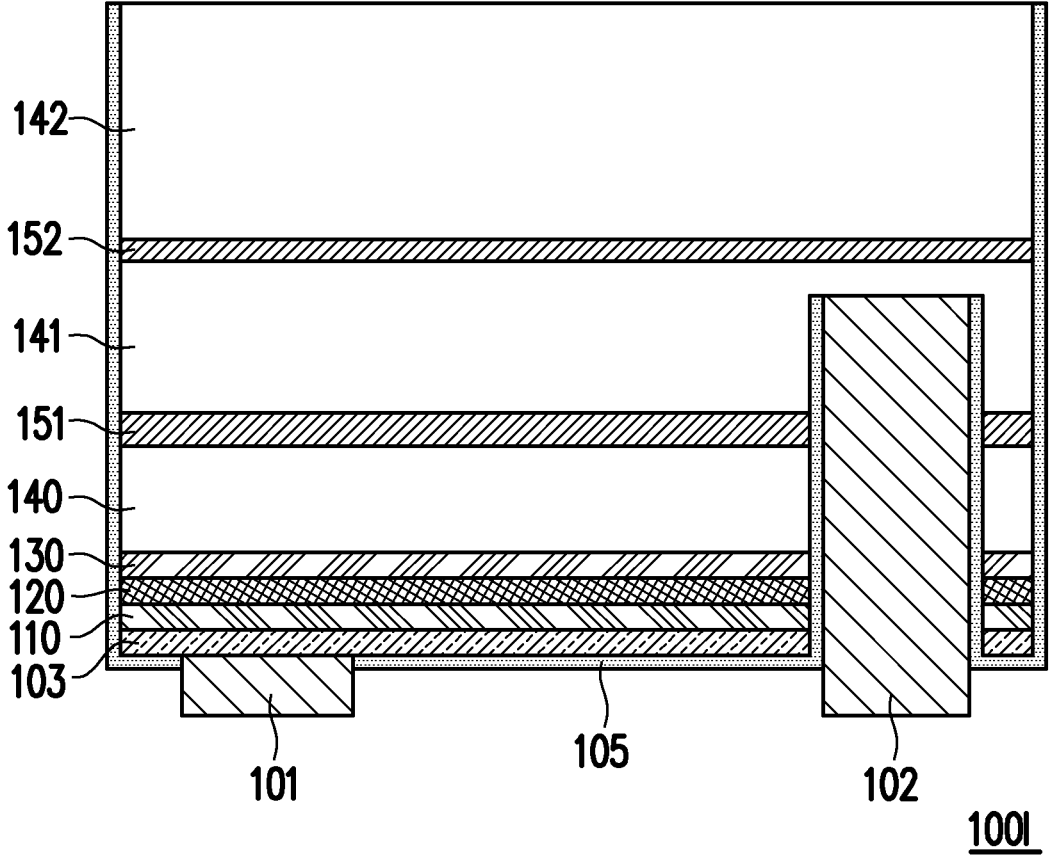

The micro light-emitting component 100I shown in FIG. 4B is similar in structure to the micro light-emitting component 100A shown in FIG. 1B, the difference is that, as shown in FIG. 4B, the second type electrode 102 passes through the first interposer 151 and is inserted into the second window layer 141 to be electrically connected to the second window layer 141, which facilitates the current to distribute in the second window layer 141 with relatively less dislocation defect density, which then enters the first window layer 140. In an embodiment not shown, the second type electrode 102 may further pass through the second window layer 141 and the second interposer 152, and be inserted into the third window layer 142 to be electrically connected to the third window layer 142, which facilitates the current to distribute in the third window layer 142 with relatively less dislocation defect density, which then enters the second window layer 141, and then enters the first window layer 140.

In an embodiment not shown, the number of the window layers may be more than four, and correspondingly, the number of the interposers may be more than three, and the interposers are separated from each other to separate more than four window layers. For example, the farther away the window layer is from the second type cladding layer 130, the larger the thickness of the window layer, or the thickness of the window layer farthest away from the second type cladding layer 130 is the largest. In addition, the farther away the interposer is from the second type cladding layer 130, the smaller the thickness of the interposer.

Figure 5:
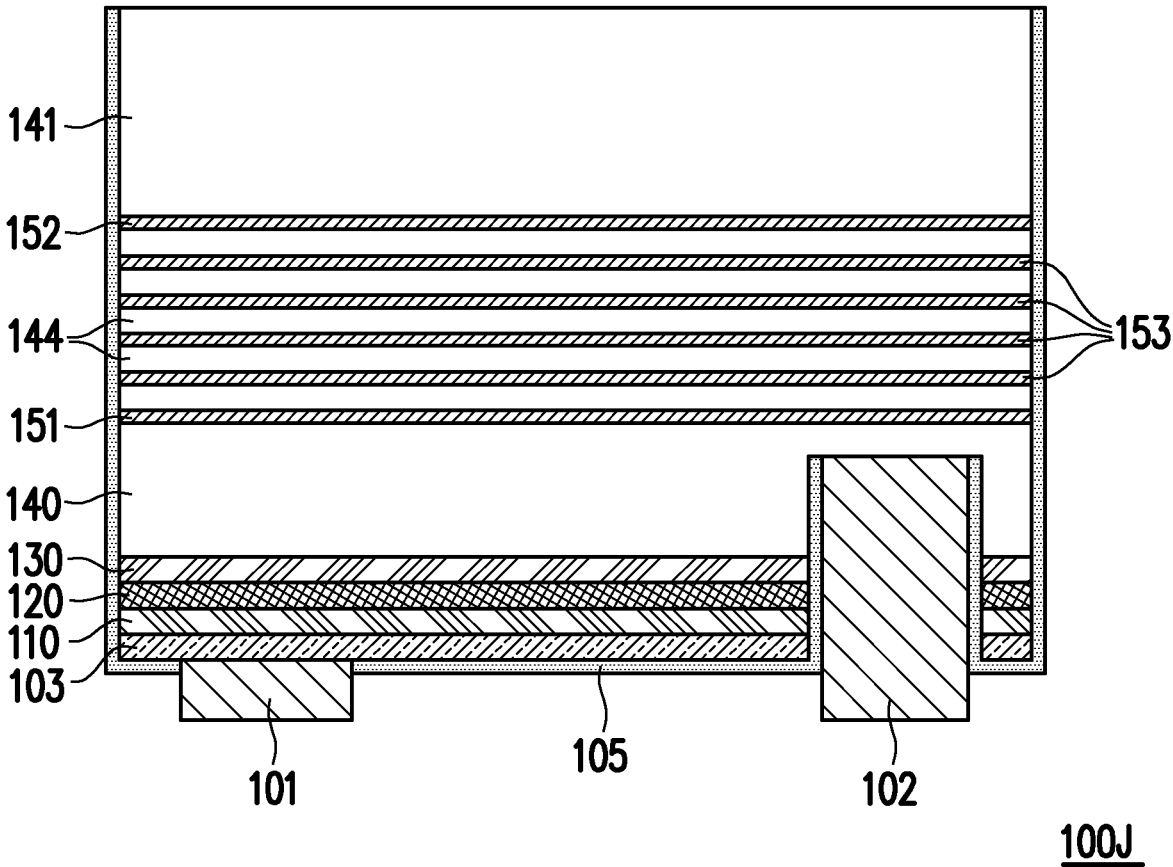

The micro light-emitting component 100J shown in FIG. 5 is similar in structure to the micro light-emitting component 100A shown in FIG. 1B, the difference is that, as shown in FIG. 5, the micro light-emitting component 100J further includes multiple spacers 144 between the first interposer 151 and the second interposer 152, and the spacers 144 are alternately arranged between the first interposer 151, multiple third interposers 153, and the second interposer 152.

The first interposer 151, the third interposers 153, the second interposer 152, and the spacers 144 form a stacked structure. The first interposer 151 and a third interposer 153 closest to the first interposer 151 are separated by a spacer 144, the adjacent two third interposers 153 are separated by a spacer 144, and a third interposer 153 closest to the second interposer 152 is separated from the second interposer 152 by a spacer 144.

In this stacked structure, the ratio of the thickness of any spacer 144 to the thickness of the first interposer 151, the thickness of the second interposer 152, or the thickness of any third interposer 153 is greater than or equal to 0.1 and less than or equal to 10, such as 3. For example, the material of the spacer 144 may be the same as the material of the window layer, such as GaP, but not limited thereto. In other embodiments similar to the micro light-emitting component 100J, the second type electrode 102 may further pass through the stacked structure and be inserted into the second window layer 141 to be electrically connected to the second window layer 141. Because the second type electrode 102 is electrically connected to the second window layer 141 with a smaller dislocation defect density, it is beneficial for diffusing the current to improve the uniformity of current distribution outside the ohmic contact region.

Figure 6:
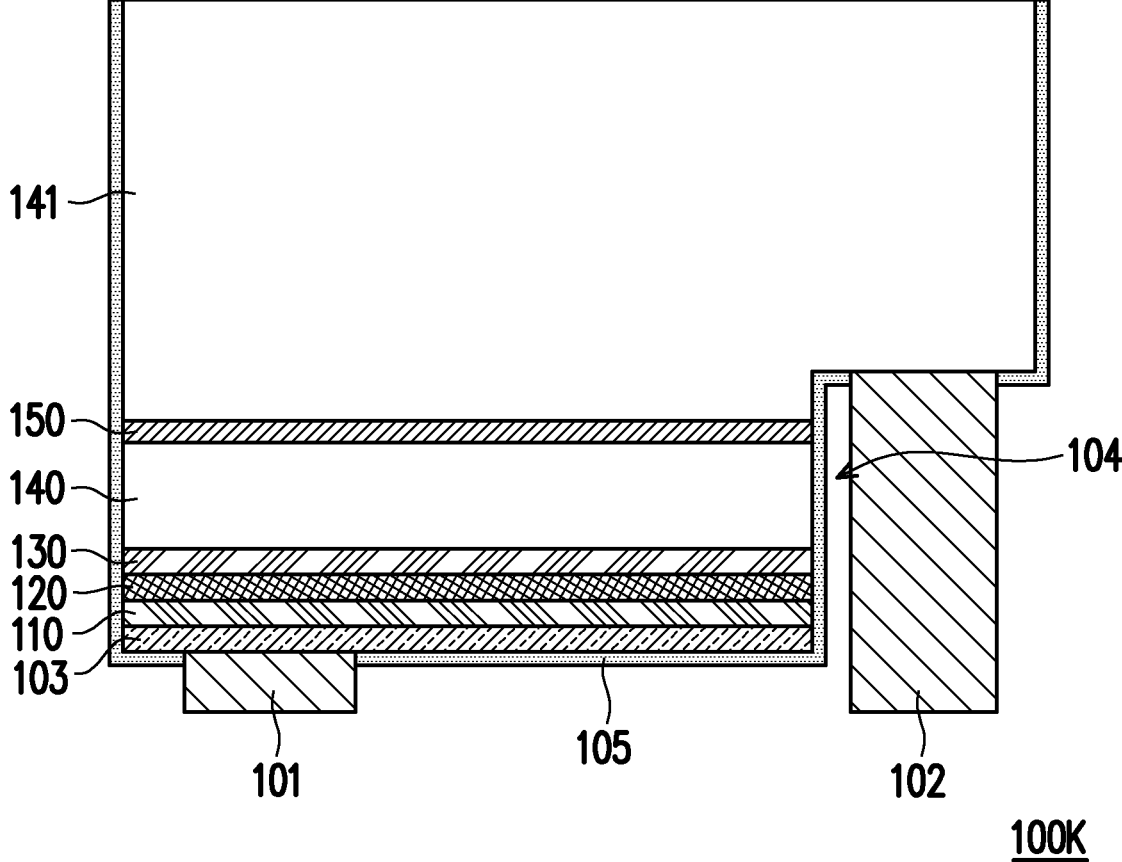

The micro light-emitting component 100K shown in FIG. 6 is similar in structure to the micro light-emitting component 100H shown in FIG. 4A, the difference is that, as shown in FIG. 6, the micro light-emitting component 100K has the platform structure 104. The second type electrode 102 is located on one side of the platform structure 104, and the second type electrode 102 is electrically connected to the second window layer 141 with a smaller dislocation defect density, which is beneficial for diffusing the current to improve the uniformity of current distribution outside the ohmic contact region. Additionally, an interposer 150 is located in the platform structure 104.

That is, in the micro light-emitting component of the aforementioned different embodiments, the variation of the electrical connection between the second type electrode 102 and the second window layer 141 may have the platform structure 104, in which the second type electrode 102 is located on one side of the platform structure 104, and at least one interposer is located in the platform structure 104.

Figure 7:
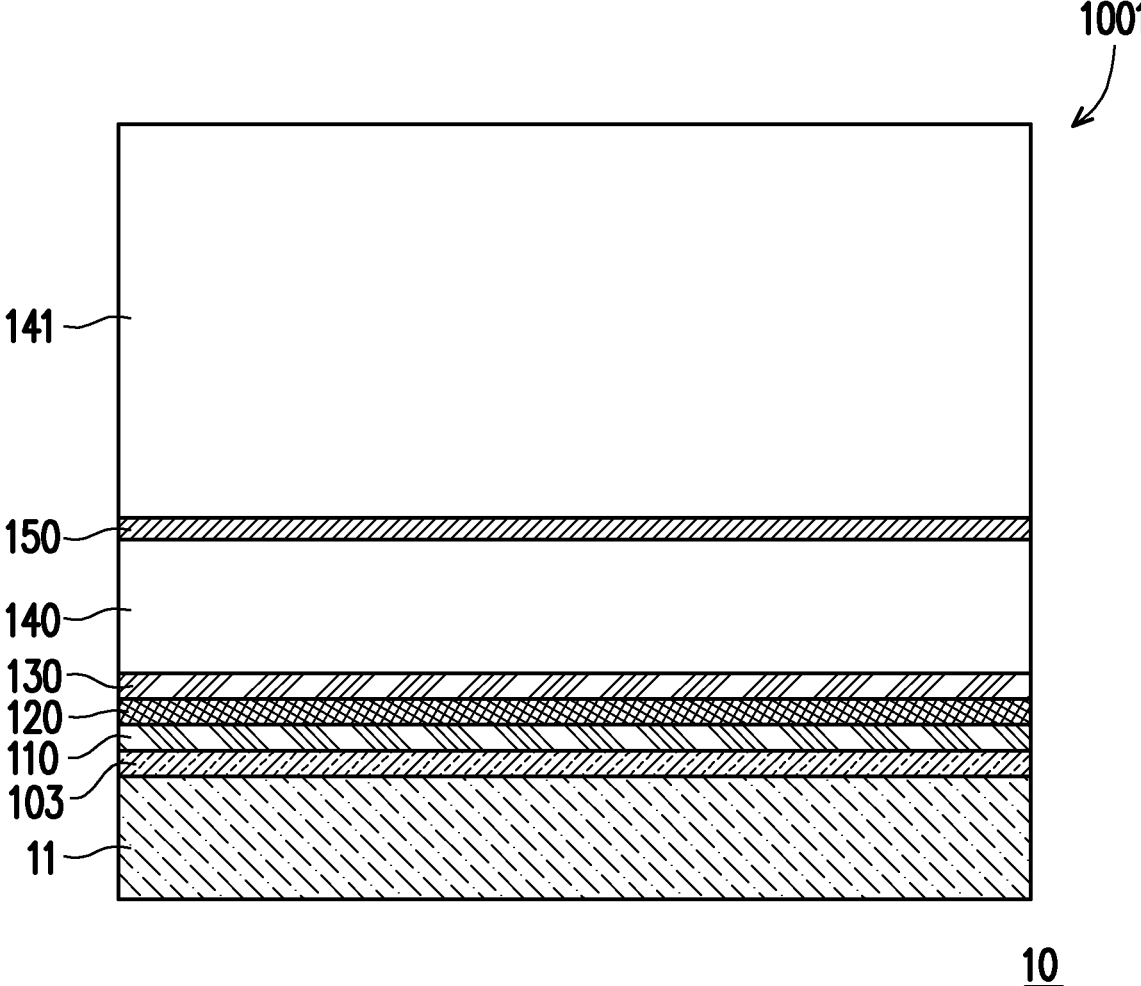
FIG. 7 is a cross-sectional schematic view of a micro light-emitting component epitaxial structure according to an embodiment of the disclosure.

FIG. 7 is a cross-sectional schematic view of a micro light-emitting component epitaxial structure according to an embodiment of the disclosure. Referring to FIG. 7, the micro light-emitting component epitaxial structure 10 includes a substrate 11 and an epitaxial structure 1001 located on the substrate 11. The substrate 11 may be a gallium arsenide substrate, and the epitaxial structure 1001 is formed of a contact layer 103, a first type cladding layer 110, a light-emitting layer 120, a second type cladding layer 130, a first window layer 140, an interposer 150, and a second window layer 141 sequentially stacked from bottom to top. The micro light-emitting components of the aforementioned different embodiments may be fabricated on the basis of the epitaxial structure 1001 or by a variation of the epitaxial structure 1001. Because the dislocation defect density in the window layer is reduced, the quality of the micro light-emitting component epitaxial structure 10 is improved.

To sum up, in the micro light-emitting component and the micro light-emitting component epitaxial structure of the disclosure, any two adjacent window layers are separated by an interposer, so as to block the dislocation defects formed in the lower window layer due to the mismatch between the lattice constant of the lower window layer and the lattice constant of the second type cladding layer. That is, the interposer may be used to block dislocation defects continuously generated from the lower window layer to the upper window layer, so as to reduce the dislocation defect density in the window layer and improve the leakage current situation. Due to the improvement of the leakage current situation, it facilitates the improvement to the luminous efficiency of the micro light-emitting component. In addition, the epitaxial quality of the micro light-emitting component epitaxial structure is improved due to the reduction in the dislocation defect density in the window layer.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A micro light-emitting component, comprising:
   a first type cladding layer,
   a light-emitting layer, located on the first type cladding layer;
   a second type cladding layer, located on the light-emitting layer, wherein the light-emitting layer is located between the first type cladding layer and the second type cladding layer;
   a plurality of window layers, located on the second type cladding layer,
   wherein the window layers are formed by a same material, and the window layers at least comprise a first window layer closest to the second type cladding layer and a second window layer farther away from the second type cladding layer than the first window layer, a thickness of the second window layer is more than 2.5 times and less than 10 times a thickness of the first window layer; and
   at least one interposer, located between any two adjacent of the window layers, wherein the first window layer and the second window layer have a same first lattice constant, and the at least one interposer has a second lattice constant, wherein a ratio of the second lattice constant to the first lattice constant is greater than or equal to 1.01 or less than 0.99,
   wherein an ion doping concentration of the at least one interposer is less than or equal to an ion doping concentration of the window layers.

2. The micro light-emitting component according to claim 1, wherein an ion doping concentration of the first window layer is less than an ion doping concentration of the second window layer.

3. The micro light-emitting component according to claim 1, wherein the material of the window layers comprises GaP or InP.

4. The micro light-emitting component according to claim 1, wherein a material of the at least one interposer comprises $(Al_xGa_{1-x})_{1-y}In_yP$, where $1 \geq x \geq 0$, and $1 > y > 0$.

5. The micro light-emitting component according to claim 1, wherein a lattice constant difference between the at least one interposer and the window layers is larger than a lattice constant difference between the second type cladding layer and the window layers.

6. The micro light-emitting component according to claim 1, wherein a thickness of the at least one interposer is less than or equal to 100 nanometers.

7. The micro light-emitting component according to claim 1, wherein a dislocation defect density in a window layer of the window layers closest to the second type cladding layer is greater than a dislocation defect density in remaining window layers of the window layers.

8. The micro light-emitting component according to claim 1, wherein the at least one interposer comprises two sub-interposers that are connected, and element ratios of the two sub-interposers are different.

9. The micro light-emitting component according to claim 8, wherein in the two sub-interposers that are connected, a lattice constant difference between one of the sub-interposers and the window layers farther away from the second type cladding layer is less than a lattice constant difference between another one of the sub-interposers and the window layers close to the second type cladding layer.

10. The micro light-emitting component according to claim 1, further comprising a plurality of spacers between the first window layer and the second window layer, wherein a number of the at least one interposer is a plurality of layers, the interposers and the spacers alternately arranged between the interposers form a stacked structure, and in the stacked structure, a ratio of a thickness of any one of the spacers to a thickness of any one of the interposers is greater than or equal to 0.1 and less than or equal to 10.

11. The micro light-emitting component according to claim 1, wherein the micro light-emitting component further comprises a first type electrode electrically connected to the first type cladding layer and a second type electrode electrically connected to the second type cladding layer, the second type electrode passes through the first type cladding layer, the light-emitting layer, the second type cladding layer, the first window layer, and the at least one interposer, and is electrically connected to the second window layer.

12. The micro light-emitting component according to claim 1, wherein a number of the at least one interposer is a plurality of layers, and the interposers are respectively located between any two adjacent of the window layers.

13. A micro light-emitting component, comprising:

a first type cladding layer;

a light-emitting layer, located on the first type cladding layer;

a second type cladding layer, located on the light-emitting layer, wherein the light-emitting layer is located between the first type cladding layer and the second type cladding layer;

a plurality of window layers, located on the second type cladding layer, wherein the window layers are formed by a same material, and the window layers at least comprise a first window layer closest to the second type cladding layer and a second window layer farther away from the second type cladding layer than the first window layer, a thickness of the second window layer is more than 2.5 times and less than 10 times a thickness of the first window layer; and at least one interposer, located between any two adjacent of the window layers, wherein the first window layer and the second window layer have a same first lattice constant, and the at least one interposer has a second lattice constant, wherein a ratio of the second lattice constant to the first lattice constant is greater than or equal to 1.01 or less than 0.99.

14. The micro light-emitting component according to claim 13, wherein the material of the window layers comprises gallium phosphide or indium phosphide.

15. The micro light-emitting component according to claim 13, wherein a material of the at least one interposer comprises $(Al_xGa_{1-x})_{1-y}In_yP$, where $1 \geq x \geq 0$, and $1 > y > 0$.

16. The micro light-emitting component according to claim 13, wherein a thickness of the at least one interposer is less than or equal to 100 nanometers.

17. The micro light-emitting component according to claim 15, wherein the micro light-emitting component further comprises a first type electrode electrically connected to the first type cladding layer and a second type electrode electrically connected to the second type cladding layer, the second type electrode passes through the first type cladding layer, the light-emitting layer, the second type cladding layer, the first window layer, and the at least one interposer, and is electrically connected to the second window layer.

18. The micro light-emitting component according to claim 13, wherein a dislocation defect density in a window layer of the window layers closest to the second type cladding layer is greater than a dislocation defect density in remaining window layers of the window layers.

* * * * *